United States Patent
Kirkpatrick et al.

(10) Patent No.: US 9,620,423 B2
(45) Date of Patent: Apr. 11, 2017

(54) INTEGRATED CIRCUIT HAVING CHEMICALLY MODIFIED SPACER SURFACE

(71) Applicant: Texas Instruments Incorporated, Dallas, TX (US)

(72) Inventors: Brian K. Kirkpatrick, Allen, TX (US); Amitabh Jain, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/878,553

(22) Filed: Oct. 8, 2015

(65) Prior Publication Data

US 2016/0027884 A1 Jan. 28, 2016

Related U.S. Application Data

(62) Division of application No. 13/427,062, filed on Mar. 22, 2012, now Pat. No. 9,496,359.

(Continued)

(51) Int. Cl.

| | |
|---|---|
| *H01L 29/76* | (2006.01) |
| *H01L 21/8238* | (2006.01) |
| *H01L 29/66* | (2006.01) |
| *H01L 29/78* | (2006.01) |
| *H01L 29/417* | (2006.01) |
| *H01L 29/423* | (2006.01) |
| *H01L 29/778* | (2006.01) |
| *H01L 21/02* | (2006.01) |
| *H01L 21/3065* | (2006.01) |
| *H01L 21/3105* | (2006.01) |

(Continued)

(52) U.S. Cl.
CPC .. *H01L 21/823864* (2013.01); *H01L 21/0214* (2013.01); *H01L 21/02167* (2013.01); *H01L 21/3065* (2013.01); *H01L 21/3105* (2013.01); *H01L 21/31111* (2013.01); *H01L 27/092* (2013.01); *H01L 29/161* (2013.01); *H01L 29/41775* (2013.01); *H01L 29/42364* (2013.01); *H01L 29/6653* (2013.01); *H01L 29/6656* (2013.01); *H01L 29/6659* (2013.01); *H01L 29/778* (2013.01); *H01L 29/7833* (2013.01)

(58) Field of Classification Search
CPC ......... H01L 29/2003; H01L 2924/1306; H01L 21/30604; H01L 21/31111; H01L 21/324; H01L 21/32133
See application file for complete search history.

(56) References Cited

U.S. PATENT DOCUMENTS

| | | |
|---|---|---|
| 5,149,669 A | 9/1992 | Hosaka |
| 6,140,192 A | 10/2000 | Huang et al. |

(Continued)

*Primary Examiner* — Cuong B Nguyen
(74) *Attorney, Agent, or Firm* — Jacqueline J. Garner; Charles A. Brill; Frank D. Cimino

(57) ABSTRACT

A method of fabricating an integrated circuit includes depositing a first dielectric material onto a semiconductor surface of a substrate having a gate stack thereon including a gate electrode on a gate dielectric. The first dielectric material is etched to form sidewall spacers on sidewalls of the gate stack. A top surface of the first dielectric material is chemically converted to a second dielectric material by adding at least one element to provide surface converted sidewall spacers. The second dielectric material is chemically bonded across a transition region to the first dielectric material.

15 Claims, 5 Drawing Sheets

Related U.S. Application Data

(60) Provisional application No. 61/468,308, filed on Mar. 28, 2011.

(51) Int. Cl.
*H01L 21/311* (2006.01)
*H01L 27/092* (2006.01)
*H01L 29/161* (2006.01)

(56) References Cited

U.S. PATENT DOCUMENTS

| | | |
|---|---|---|
| 6,713,392 B1 | 3/2004 | Ngo et al. |
| 2005/0269290 A1 | 12/2005 | Nozaki et al. |
| 2007/0275532 A1 | 11/2007 | Chidambarrao et al. |
| 2008/0036017 A1 | 2/2008 | Ng et al. |
| 2008/0153229 A1 | 6/2008 | Hwang et al. |
| 2009/0246926 A1 | 10/2009 | Gehring et al. |
| 2012/0049247 A1* | 3/2012 | Lee .................. H01L 21/28114 257/288 |
| 2013/0164940 A1 | 6/2013 | Raley et al. |

* cited by examiner

US 9,620,423 B2

1

INTEGRATED CIRCUIT HAVING CHEMICALLY MODIFIED SPACER SURFACE

CROSS REFERENCE TO RELATED APPLICATIONS

This application is a division of application Ser. No. 13/427,062 filed Mar. 22, 2012, and claims the benefit of Provisional Application Ser. No. 61/463,308, entitled "Surface modification to optimize wet etch resistance" filed Mar. 28, 2011, which is herein incorporated by reference in its entirety.

FIELD

Disclosed embodiments relate to semiconductor processing and integrated circuit (IC) devices therefrom which include metal-oxide-semiconductor (MOS) transistors, including MOS transistors having multi-layer sidewall spacers.

BACKGROUND

While processing semiconductor wafers it is often advantageous to deposit or form films that can later act as etch stop layers when subsequently deposited or formed films are removed. However, if the film does not have sufficient etch resistance during later processing, such films can be inadvertently removed.

One example of inadvertent removal involves thin silicon nitride sidewall (or offset) spacers for MOS transistors. Thin silicon nitride sidewall spacers are commonly used as an implant mask to provide a space between the lightly doped drain (LDD) implants into the semiconductor surface and the gate stack. A typical process flow has a first spacer layer that acts first as an offset spacer, then as an underlayer/etch-stop while additional films, such as disposable second sidewall spacer comprising SiGe, is deposited on top, used, which is then subsequently removed. In one process flow hot phosphoric acid (HPA) is used to remove the second sidewall spacer. However, even silicon nitride spacers formed from bis-tertiarybutylamino-silane (BTBAS) and ammonia reagents, where BTBAS-based silicon nitride is known to be the most wet etch resistant silicon nitride film to HPA, are not always capable of stopping the HPA etch when the disposable SiGe second sidewall spacer is removed. In particular, if the silicon nitride sidewall spacer has been exposed to reducing chemistries, such as plasmas containing $H_2$ or $N_2$, etch stop characteristics can be lost resulting in inadvertent removal of the silicon nitride offset sidewall spacer, and as a result subsequent shorting between the gate and source and/or drain, such as due to a subsequently deposited silicide ion the gate, source and drain. Moreover, as semiconductor devices are shrunk in size, and the distance between the top of the gate stack and the top surface of the source/drain regions is reduced, the probability of electrical shorts due to the silicide forming on the sidewalls of the gate stack increases.

SUMMARY

Disclosed embodiments describe solutions to the above-described inadvertent removal of thin sidewall spacers for metal-oxide-semiconductor (MOS) transistors that use multi-layer sidewall spacers. By chemically converting the top surface of a first sidewall spacer comprising a first material by adding at least one element to form a second dielectric material, the second material can substantially increase the etch resistance compared to the first spacer material. As a result, the subsequent removal of a disposable second spacer on the first spacer will not remove the first spacer since the second dielectric material can act as an etch stop, or at least provide some etch protection for the first dielectric material of the first spacer.

One disclosed embodiment comprises a method of fabricating an integrated circuit that includes depositing a first dielectric material onto a semiconductor surface of a substrate having a gate stack thereon including a gate electrode on a gate dielectric. The first dielectric material is etched, such as using RIE, to form sidewall spacers on sidewalls of the gate stack. A top surface of the first dielectric material is chemically converted to a second dielectric material by adding at least one element to provide surface converted sidewall spacers. The second dielectric material is chemically bonded across a transition region to the first dielectric material.

Following forming the surface converted sidewall spacers, ion implanting can follow to form lightly doped drains (LDDs) in the semiconductor surface lateral to the gate stack. Second spacers are then formed on the surface converted sidewall spacers. Sources and drains are then formed lateral to the gate stack. Ion implanting can be used to form sources and drains in the semiconductor surface lateral to the gate stack after forming the second spacers. Alternatively, the second sidewall spacers can be used for a SiGe S/D process (e.g., where recesses are formed typically in the PMOS region and replaced with SiGe). The second spacers can then be selective removed after the source/drain formation. The surface of chemically converted layer remains intact after the selective etching, as does the first dielectric material protected by the surface converted layer.

BRIEF DESCRIPTION OF THE DRAWINGS

Reference will now be made to the accompanying drawings, which are not necessarily drawn to scale, wherein:

FIG. 2A-2F are cross-sectional diagrams depicting processing progression for an example method of forming an IC device having MOS transistors that include surface converted sidewall spacers, according to an example embodiment, while

DETAILED DESCRIPTION

Figure 1:
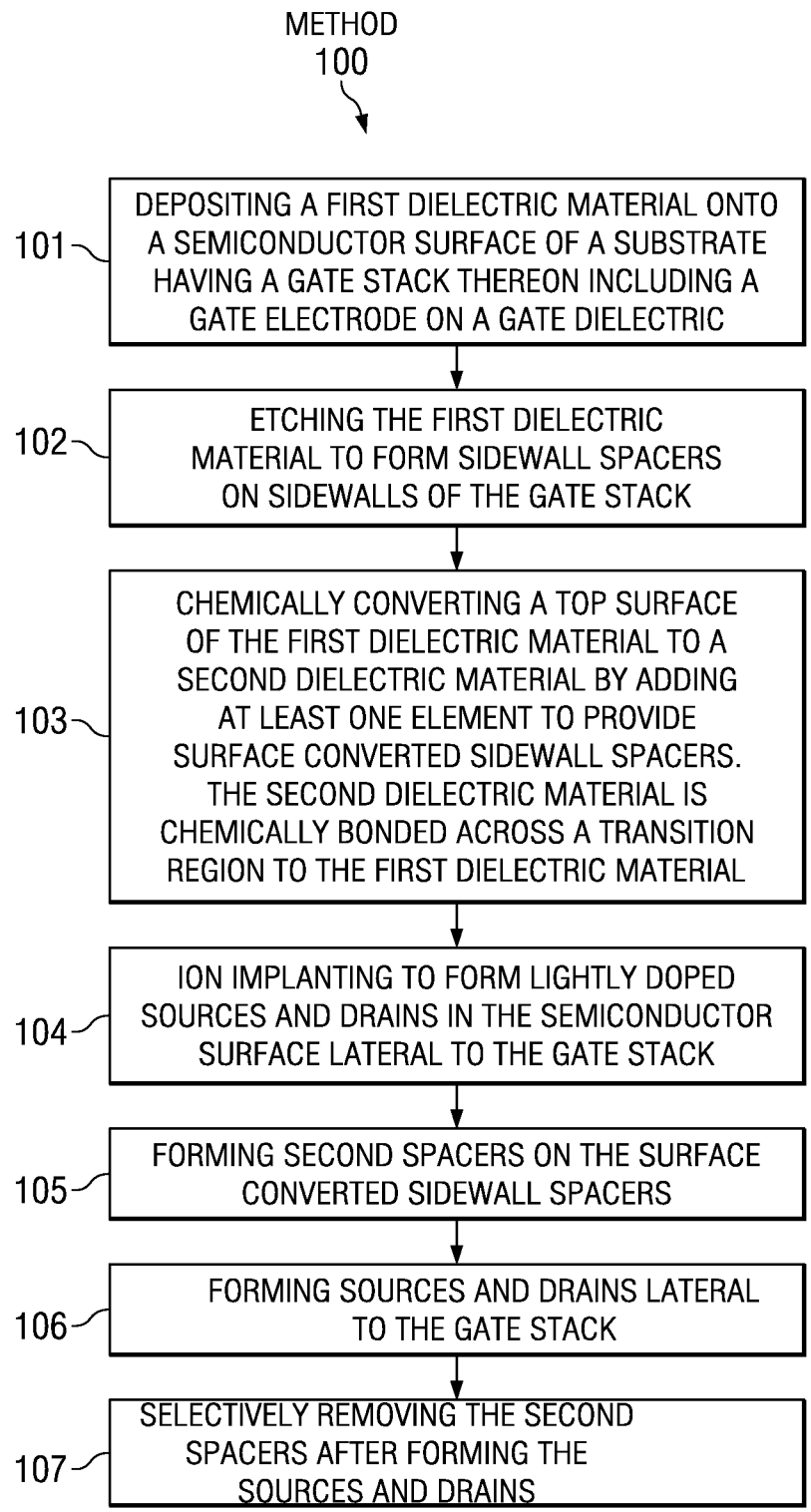
FIG. 1 is a flow chart that shows steps in an example method for fabricating an integrated circuit (IC) device having MOS transistors that include surface converted sidewall spacers, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for fabricating an IC device having MOS transistors that include surface converted sidewall spacers, according to an example embodiment. Step 101 comprises depositing a first dielectric material onto a semiconductor surface of a substrate having a gate stack thereon comprising a gate electrode on a gate dielectric. Step 102 comprises etching the first dielectric material to form sidewall spacers on sidewalls of the gate stack, such as using RIE.

Step 103 comprises chemically converting a top surface of the first dielectric material to a second dielectric material by adding at least one element to provide surface converted sidewall spacers. The second dielectric material is chemically bonded across a transition region to the first dielectric material. The chemically converted top surface of the sidewall spacer becomes an etch stop by adding at least one element to form a second dielectric material, that substantially increases the wet etch resistance of the film as compared to the unconverted first dielectric material, such as to a hot phosphoric acid (HPA) etch. In one embodiment the added element is carbon. In another embodiment both carbon and oxygen are added.

In one specific example, the first dielectric material comprises BTBAS-derived silicon nitride, and carbon is added to the top surface of the silicon nitride forming a thin layer, typically 10 to 20 Angstroms thick, of a second dielectric material comprising a silicon carbide (SiC), silicon carbonitride (SiCN) and/or silicon oxy-carbonitride (SiOCN) film. This can be accomplished by exposing a BTBAS silicon nitride film that was previously used as a gate stack sidewall to a flow of 30 to 3000 sccm of ethylene, acetylene, or similar hydrocarbon gas at a temperature generally between 300 and 800° C., and pressure between about 0.1 and 10 Torr, for 15-600 seconds or longer prior to depositing a subsequent disposable spacer film. In experiments performed, SiC, SiCN, or SiOCN were formed, which were all found to be largely impervious to HPA etch at temperatures below 215° C. Since HPA is generally used at temperatures between 120 and 180° C., the underlying silicon nitride sidewall spacer is protected by the second dielectric material.

Besides clear process differences, the relationship of the second dielectric material to the first dielectric material for disclosed surface converted sidewall spacers being chemically bonded together is distinct from known arrangements resulting from the vapor deposition (e.g., chemical vapor deposition) of a second dielectric material on a first dielectric material, where the second dielectric material becomes attached to the first dielectric material by comparatively weak Vander walls forces. Moreover, inherently due to the disclosed chemical conversion process, the area of the second dielectric material matches the area of the first dielectric material. In contrast, for a known arrangements resulting from the vapor deposition of a second dielectric material on a first dielectric material, the area of the second dielectric material will be different as compared to the area of the first dielectric material due to the etching process required for spacer formation.

Step 104 comprises ion implanting to form lightly doped drains (LDDs) in the semiconductor surface lateral to the gate stack. For a CMOS process the PMOS transistors and NMOS transistors generally each receive separate LDD implants. Step 105 comprises forming second spacers on the surface converted sidewall spacers. Step 106 comprises forming sources and drains lateral to the gate stack. Ion implanting can be used to form sources and drains in the semiconductor surface lateral to the gate stack after forming the second spacers. For a typical CMOS process the PMOS transistors and NMOS transistors each receive separate source/drain implants. However, alternatively, the second sidewall spacers can also be used for a SiGe S/D process (e.g., where recesses are formed typically in the PMOS region and replaced with SiGe). Step 107 comprises selectively removing the second spacers after the source/drain formation (step 106). The surface of chemically converted layer remains intact after the selective etching, as does the first dielectric material protected by the surface converted layer.

Figure 2A:
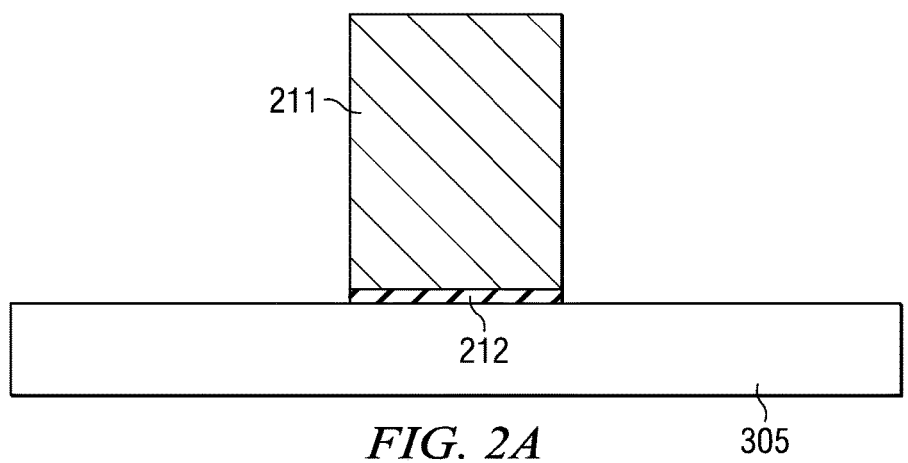
Figure 2B:
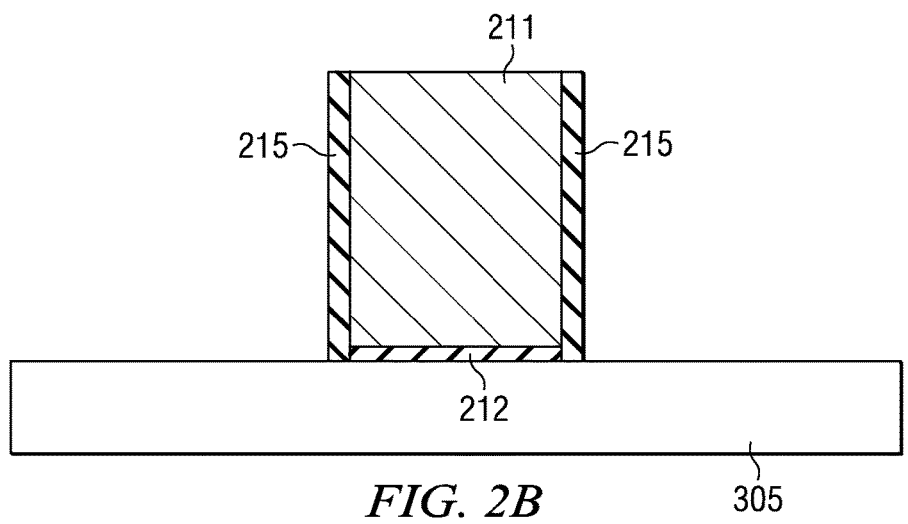
Figure 2C:
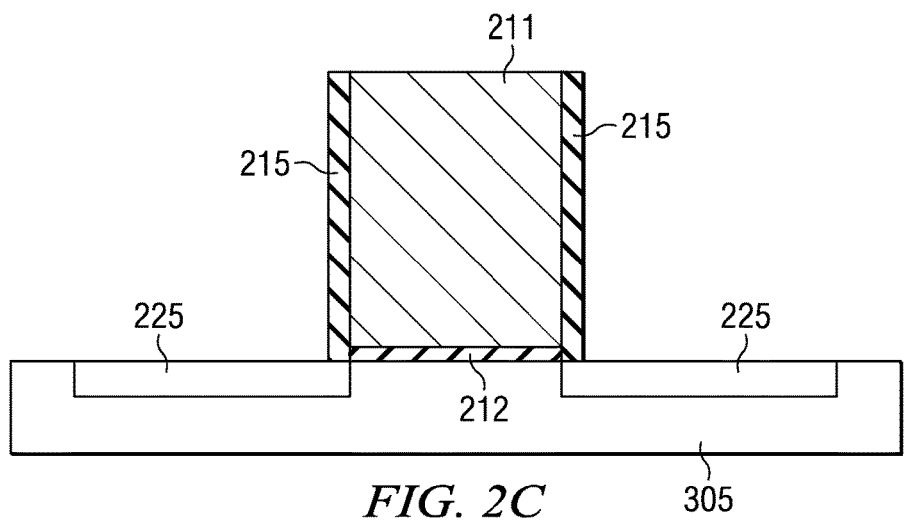
Figure 2D:
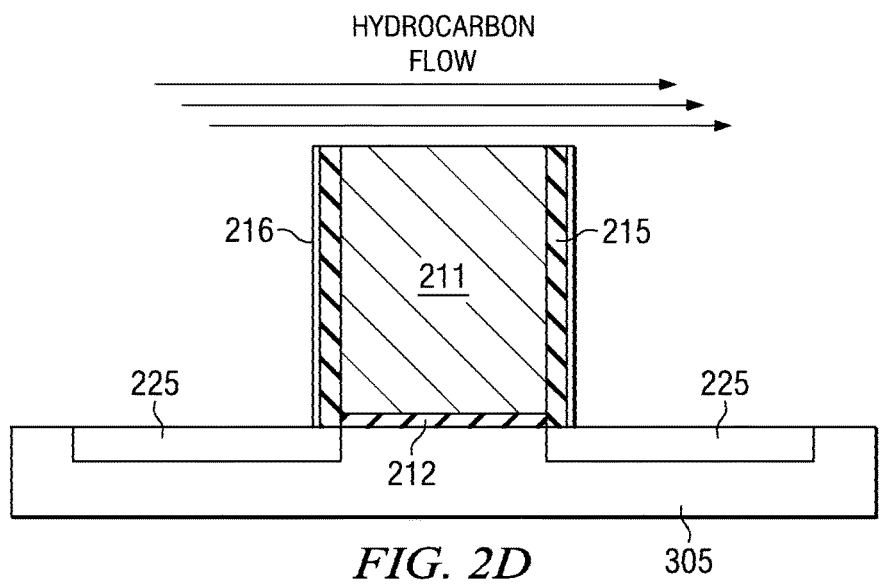
Figure 2E:
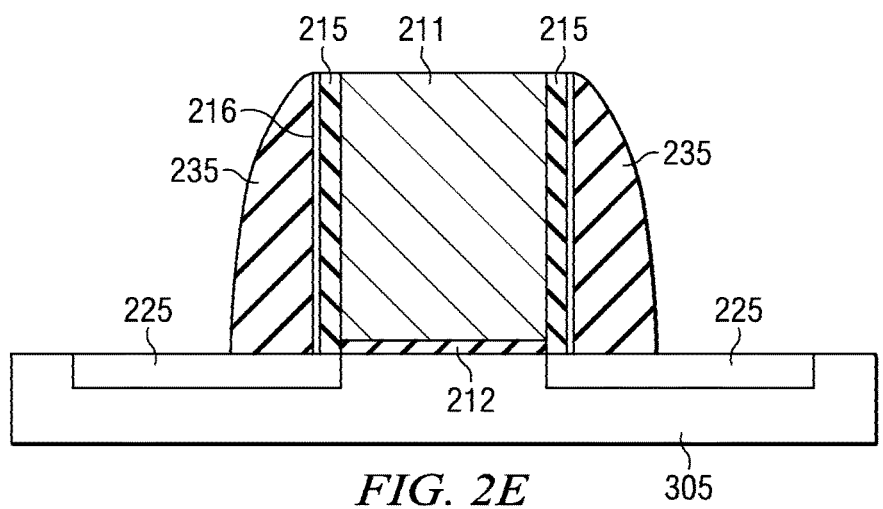
Figure 2F:
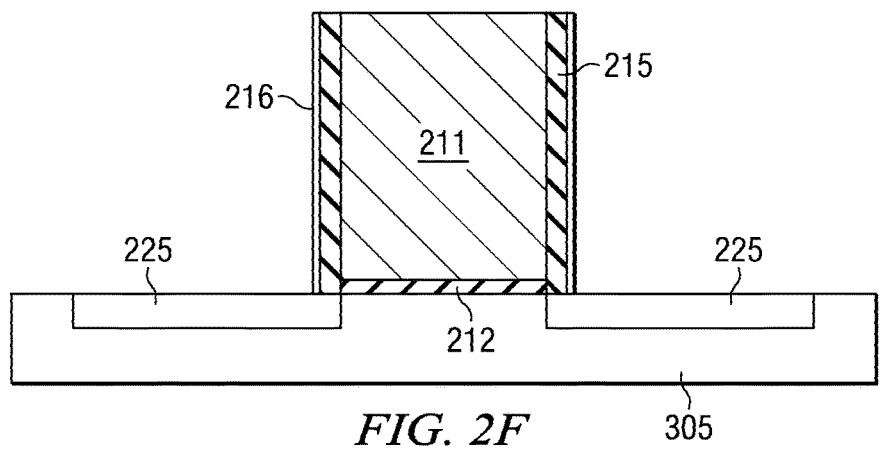
Figure 2G:
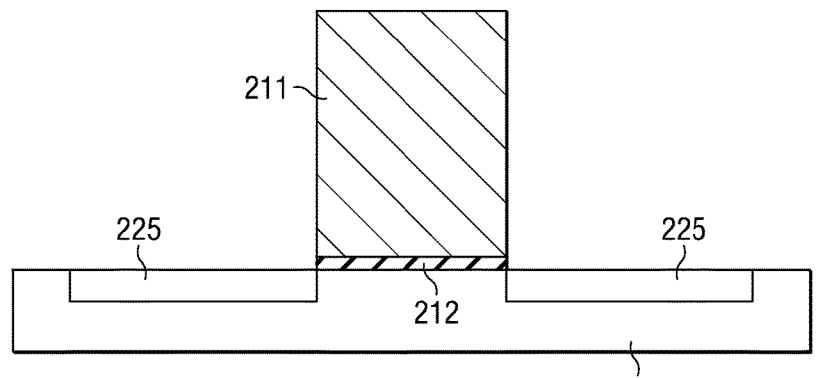
FIG. 2G shows the resulting spacer structure after a known spacer process showing the results from the inadvertent removal of the nitride offset spacer.

FIG. 2A-2F are cross-sectional diagrams showing processing progression for an example method of fabricating an IC device having surface converted sidewall spacers, according to an example embodiment, while FIG. 2G shows the resulting spacer structure after a known spacer process showing inadvertent removal of the sidewall spacer. FIG. 2A shows a gate stack comprising a gate electrode 211 on a gate dielectric 212 before any sidewall spacer is formed on a substrate 305. Substrate 305 can comprise any substrate material, such as silicon, silicon-germanium, as well as II-VI and III-V substrates, as well as SOI substrates. The gate electrode 211 can comprise polysilicon, or a variety of other gate electrode materials. The gate dielectric 212 can comprise a variety of gate dielectrics, including optional high-k dielectrics defined hereon as having k>3.9, typically a k>7. In one particular embodiment, the high-k dielectric comprises silicon oxynitride.

FIG. 2B shows the gate stack after a sidewall spacer (e.g., a nitride offset spacer) 215 is formed, such as a silicon nitride offset spacer by a RIE process. FIG. 2C shows the results after an ion implantation process, such as LDD ion implantation to form LDD regions 225, that utilized implant blocking provided by the sidewall spacer 215. FIG. 2D shows the resulting structure after disclosed chemical surface conversion step comprising flowing a hydrocarbon gas that forms the surface converted layer 216 shown. FIG. 2E shows the gate stack 211/212 after a subsequent disposable second spacer 235 is formed, such as by chemical deposition followed by RIE. For a typical CMOS process the PMOS transistors and NMOS transistors each then receive separate source/drain implants.

The disposable second spacer 235 is then selectively removed after source/drain formation. FIG. 2F shows the gate stack 212/211 after the disposable second spacer 235 has been selectively removed, such as by a hot (e.g., 120 to 180° C.) HPA etch. Note the surface converted layer 216 remains intact after the etch, as does the sidewall spacer 215 protected by the surface converted layer 216. Without a disclosed surface converted layer, the sidewall spacer 215, such as it comprises silicon nitride, is subject to removal using the process used to remove the disposable second spacer 235. FIG. 2G shows the resulting spacer structure after a known spacer process showing the results after inadvertent complete removal of the sidewall spacer 215.

Figure 3:
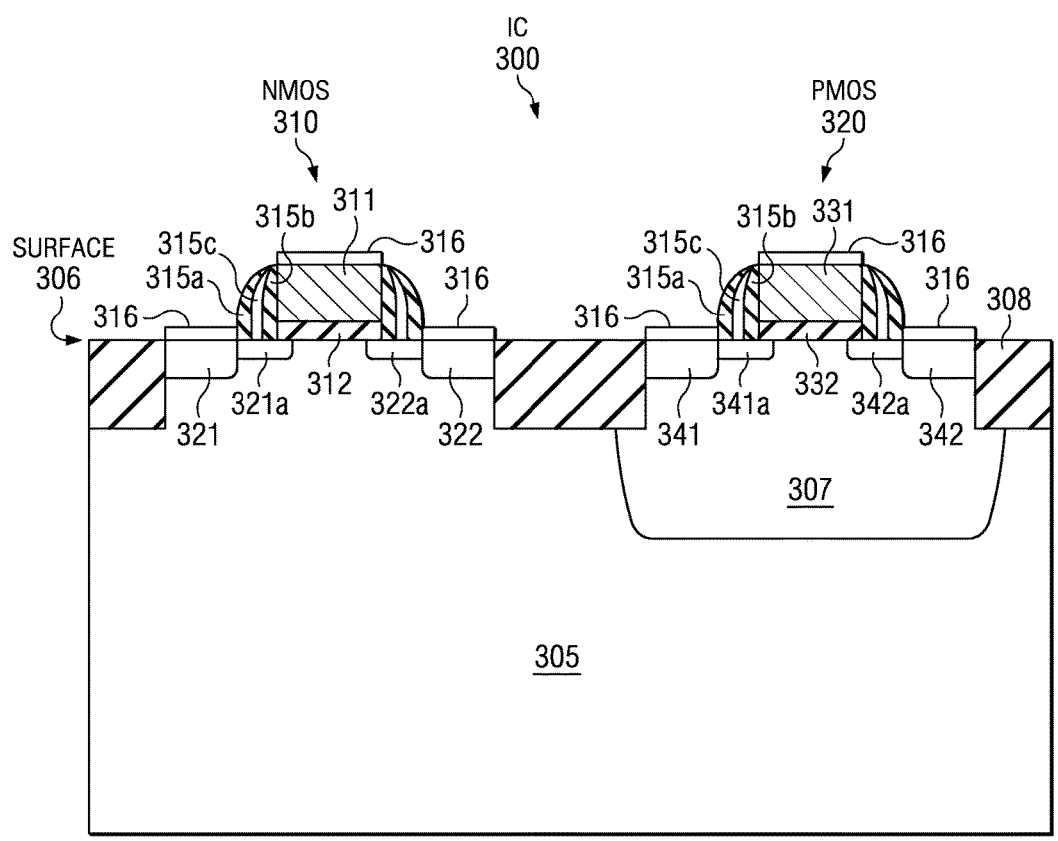
FIG. 3 is a cross sectional view of a portion of an IC device including MOS transistors having sidewall spacers comprising a second dielectric material on a first dielectric material, wherein the second dielectric material is chemically bonded across a transition region to the first dielectric material, according to an example embodiment.

FIG. 3 is a cross sectional view of a portion of an IC device 300 (e.g., a semiconductor die) including MOS transistors having surface converted sidewall spacers comprising a second dielectric material on a first dielectric material, wherein the second dielectric material is chemically bonded across a transition region to the first dielectric material, according to an example embodiment. Back end of the line (BEOL) metallization is not shown for simplicity. IC 300 includes a substrate 305, such as a p-type silicon or p-type silicon-germanium substrate, having a semiconductor surface 306. Optional trench isolation 308 is shown, such as shallow trench isolation (STI). An n-channel MOS (NMOS) transistor 310 is shown, along with a p-channel MOS (PMOS) transistor 320 that is within an n-well 307.

NMOS transistor 310 includes a gate stack including a gate electrode 311 on a gate dielectric 312 having sidewall spacers on sidewalls of the gate stack. The sidewall spacers comprise a second dielectric material 315a on a first dielectric material 315b, wherein the second dielectric material 315a is chemically bonded across a transition region 315c to the first dielectric material 315b. The second dielectric material 315a comprises carbon and the first dielectric material does not comprise carbon, wherein "not comprising carbon" as used herein refers to a wt. % of C<3%.

NMOS transistor 310 includes source 321 and drain 322 regions lateral to the sidewall spacers, and include lightly doped extensions 321a and 322a. A silicide layer 316 is shown on the gate electrode 311 and the source 321 and drain 322.

Similarly, PMOS transistor 320 includes a gate stack including a gate electrode 331 on a gate dielectric 332 (which can be the same material as gate dielectric 312 under gate electrode 311) having sidewall spacers on sidewalls of the gate stack, comprising the second dielectric material 315a on a first dielectric material 315b, wherein the second dielectric material 315a is chemically bonded across a transition region 315c to the first dielectric material 315b. The second dielectric material 315a comprises carbon and the first dielectric material does not comprise carbon. PMOS transistor 320 includes source 341 and drain 342 regions lateral to the sidewall spacers, and include lightly doped extensions 341a and 342a. Silicide layer 316 is shown on the gate electrode 331 and on the source 341 and drain 342.

The total thickness of the sidewall spacer 315a/315c/315b at its widest point at its base is generally ≤100 Angstroms, such as 40 to 70 Angstroms thick. For example, in one particular embodiment second dielectric material 315a is about 5 to 10 angstroms thick, transition region 315c is 15 to 25 Angstroms thick, and the first dielectric material 315b is 20 to 30 Angstroms thick.

Figure 4:
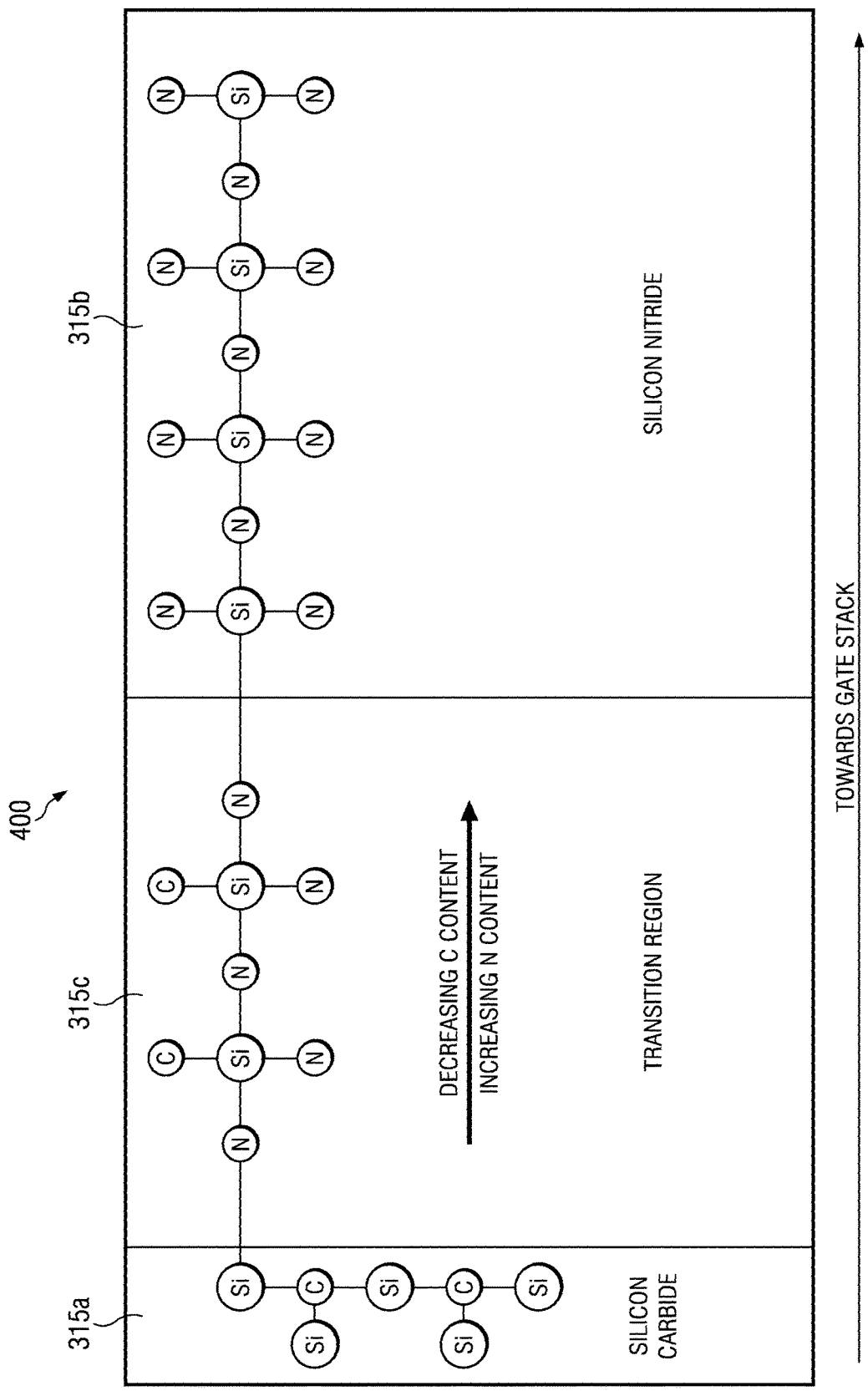
FIG. 4 shows the composition as a function of thickness for an example surface converted sidewall spacer, including a highly simplified depiction of the chemical bonding provided across the thickness of the surface converted sidewall spacer, according to an example embodiment.

FIG. 4 shows the composition as a function of thickness for an example surface converted sidewall spacer 400, including a highly simplified depiction of the chemical bonding provided across the thickness of the surface converted sidewall spacer 400, according to an example embodiment. The surface converted sidewall spacer 400 includes a non-constant chemical composition profile across its thickness comprising a first dielectric material 315b on the sidewall of a gate stack material and a chemically converted top (outer) surface comprising a second dielectric material 315a chemically bonded across a transition region 315c to the first dielectric material 315b. In the embodiment shown the first dielectric material 315b comprises silicon nitride (roughly $Si_3N_4$), the second dielectric material 315a comprises silicon carbide (SiC), and the transition region 315c includes a material comprising Si, N and C, where the C content decreases and the N content increases as the distance to the second dielectric material 315a/gate stack is reduced.

Disclosed semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:
1. An integrated circuit (IC), comprising:
a substrate having a semiconductor surface,
at least one metal-oxide-semiconductor (MOS) transistor on said semiconductor surface, said MOS transistor comprising:
gate stack including a gate electrode on a gate dielectric having sidewall spacers on sidewalls of said gate stack, said sidewall spacers comprising a second dielectric material on a first dielectric material, and
source and drain regions lateral to said sidewall spacers,
wherein said second dielectric material comprises carbon and said first dielectric material does not comprise carbon, and
wherein said second dielectric material is chemically bonded across a transition region to said first dielectric material.

2. The IC of claim 1, wherein said first dielectric material comprises silicon nitride and said second dielectric material comprises (SiC), silicon carbonitride (SiCN) or silicon oxy-carbonitride (SiOCN).

3. The IC of claim 1, wherein an area of said second dielectric material matches an area of said first dielectric material.

4. The IC of claim 1, wherein a total thickness of said sidewall spacers is ≤100 Angstroms.

5. An integrated circuit (IC), comprising:
a substrate having a semiconductor surface,
at least one metal-oxide-semiconductor (MOS) transistor at said semiconductor surface, said MOS transistor comprising:
gate stack including a gate electrode on a gate dielectric having sidewall spacers on sidewalls of said gate stack, said sidewall spacers comprising a second dielectric material on a first dielectric material; and
source and drain regions on adjacent sides of said gate stack;
wherein said second dielectric material comprises the first dielectric material plus carbon; and
wherein said second dielectric material is chemically bonded to said first dielectric material.

6. The IC of claim 5, wherein said first dielectric material comprises silicon nitride and said second dielectric material comprises silicon carbonitride (SiCN).

7. The IC of claim 5, wherein said first dielectric material comprises silicon nitride and said second dielectric material comprises silicon oxy-carbonitride (SiOCN).

8. The IC of claim 5, wherein an area of said second dielectric material matches an area of said first dielectric material.

9. The IC of claim 5, wherein a total thickness of said sidewall spacers is ≤100 Angstroms.

10. An integrated circuit (IC), comprising:
a substrate having a semiconductor surface, at least one metal-oxide-semiconductor (MOS) transistor at said semiconductor surface, said MOS transistor comprising:
  gate stack including a gate electrode on a gate dielectric having sidewall spacers on sidewalls of said gate stack, said sidewall spacers comprising a second dielectric material, a first dielectric material, and a transition region between the second dielectric material and the first dielectric material; and
  source and drain regions in said semiconductor surface on adjacent sides of said gate electrode;
  wherein said second dielectric material comprises carbon and the first dielectric material does not comprise carbon; and
  wherein said second dielectric material is chemically bonded across said transition region to said first dielectric material.

11. The IC of claim 10, wherein said first dielectric material comprises silicon nitride and said second dielectric material comprises silicon carbonitride (SiCN).

12. The IC of claim 10, wherein said first dielectric material comprises silicon nitride and said second dielectric material comprises silicon oxy-carbonitride (SiOCN).

13. The IC of claim 10, wherein said first dielectric material comprises silicon nitride and said second dielectric material comprises silicon carbide (SiC).

14. The IC of claim 10, wherein an area of said second dielectric material matches an area of said first dielectric material.

15. The IC of claim 10, wherein a total thickness of said sidewall spacers is ≤100 Angstroms.

* * * * *